(12) United States Patent
De Rauw et al.

(10) Patent No.: US 12,174,543 B2
(45) Date of Patent: Dec. 24, 2024

(54) APPARATUS AND METHOD FOR EXPOSURE OF RELIEF PRECURSORS

(71) Applicant: XSYS PREPRESS NV, Ypres (BE)

(72) Inventors: Dirk Ludo Julien De Rauw, Ninove (BE); Pieter Lenssens, Zottegem (BE); Frederik Defour, Boezinge (BE)

(73) Assignee: XSYS PREPRESS NV, Ypres (BE)

( * ) Notice: Subject to any disclaimer, the term of this patent is extended or adjusted under 35 U.S.C. 154(b) by 212 days.

(21) Appl. No.: 17/793,870

(22) PCT Filed: Jan. 18, 2021

(86) PCT No.: PCT/EP2021/050955
§ 371 (c)(1),
(2) Date: Jul. 19, 2022

(87) PCT Pub. No.: WO2021/148354
PCT Pub. Date: Jul. 29, 2021

(65) Prior Publication Data
US 2023/0059435 A1 Feb. 23, 2023

(30) Foreign Application Priority Data
Jan. 24, 2020 (NL) .................................. 2024756

(51) Int. Cl.
*G03F 7/20* (2006.01)
(52) U.S. Cl.
CPC .......... *G03F 7/2032* (2013.01); *G03F 7/2014* (2013.01)

(58) Field of Classification Search
CPC ............................ G03F 7/2022; G03F 7/2032
See application file for complete search history.

(56) References Cited

U.S. PATENT DOCUMENTS

| 5,386,268 | A | 1/1995 | Ohlig et al. | |
|---|---|---|---|---|
| 2016/0368260 | A1* | 12/2016 | De Caria | B41N 1/06 |
| 2017/0059116 | A1* | 3/2017 | Huang | F21S 41/192 |
| 2018/0210345 | A1* | 7/2018 | Wolterink | G03F 7/2004 |
| 2020/0016916 | A1* | 1/2020 | Sievers | B41C 1/05 |

FOREIGN PATENT DOCUMENTS

CN 105785723 A 7/2016

OTHER PUBLICATIONS

International Search Report and Written Opinion for PCT/EP2021/050955, mailed Apr. 14, 2021, 9 pages.

* cited by examiner

*Primary Examiner* — Steven H Whitesell
(74) *Attorney, Agent, or Firm* — KDW Firm PLLC

(57) ABSTRACT

Apparatus for exposure of a relief precursor includes a substrate layer and at least one photosensitive layer. The apparatus includes a first light source configured to illuminate a first side of the relief precursor, a movable second light source configured to illuminate a second side of the relief precursor opposite the first side, a movable shield located between the first light source and the second light source and configured to capture at least a portion of the light of the second light source transmitted through the relief precursor, and a moving means configured to move the movable shield simultaneously with the second light source.

26 Claims, 4 Drawing Sheets

APPARATUS AND METHOD FOR EXPOSURE OF RELIEF PRECURSORS

This application is a national stage filing under 35 U.S.C. 371 of pending International Application No. PCT/EP2021/050955, filed Jan. 18, 2021, which claims priority to Netherlands Patent Application No. 2024756, filed Jan. 24, 2020, the entirety of which applications are incorporated by reference herein.

FIELD OF INVENTION

The field of the invention relates to apparatus and methods for exposure of relief precursors, in particular printing plate precursors, and more in particular for front and backside exposure of printing plate precursors.

BACKGROUND

Relief structures can be made by transfer of image information onto an imageable layer and removing parts of the imageable layer. The formed relief may then be used to transfer the information in a printing step onto a substrate. An example of a relief precursor is a printing plate precursor. Digitally imageable flexible printing plate precursors are known, and typically comprise at least a dimensionally stable support layer, a photosensitive layer and a digitally imageable layer. The digitally imageable layer may be e.g. a laser-ablatable layer. In case of conventional printing plate precursors, the digitally imageable layer is replaced by a mask which is attached to a photosensitive layer.

To produce a printing plate from a printing plate relief precursor, according to existing methods, first a mask is written into the digitally imageable layer based on image data to be printed. Following the writing of the mask, the plate is exposed through the mask with radiation such that the photosensitive layer undergoes polymerization or cross-linking or a reaction changing the solubility or fluidity of the photosensitive layer in the regions which are not covered by the mask. Following the exposure, the residues of the mask and of the non-exposed portions of the photosensitive layer are removed. This may be done with one or more liquids in a washer apparatus or by thermal development wherein non-exposed material of the photosensitive layer is liquefied by temperature increase and removed.

Exposure apparatus for printing plate precursors are known. An exposure apparatus may comprise a first light source for back exposure and a second light source for front exposure. Back exposure may be done using a set of UV light tubes. The back exposure creates a solid layer (floor) onto which the relief structures are generated. Front exposure may also be done using a set of UV light tubes or may be done using a movable UV light source, such as a movable laser or a LED bar. Some exposure apparatus only do front exposure or only do back exposure, depending on the requirements. In some cases the exposure apparatus is capable to expose from both sides and embodiments of the invention relate to such cases.

US 2016/0368260 A1 discloses an autonomous apparatus for the photo-polymerization of a flexographic printing plate, which plate comprises a main face and a base opposite to said main face. The apparatus comprises an exposure chamber in which at least first photo-polymerization means of said base of said plate are installed. The apparatus further comprises moving means configured to drag a plate along a feeding direction. The first photo-polymerization means comprise a row of LEDs aligned according to a direction substantially orthogonal to said feeding direction.

US 2018/0210345 A1 discloses a method to expose photosensitive printing plates with a predetermined radiation density from the main side (top) and a predetermined radiation density from the back side (bottom). The method comprises executing the main exposure with a time delay after the back exposure.

SUMMARY

The object of embodiments of the invention is to provide apparatus and methods for the exposure of a relief precursor comprising a substrate layer and at least one photosensitive layer, using a first light source to illuminate a first side of the relief precursor and a second light source to illuminate a second side of the relief precursor, whilst avoiding ghost images and limiting the heating of the first light source by the second light source.

According to a first aspect of the invention, the apparatus comprises a first light source, a movable second light source, a movable shield, and a moving means. The first light source is configured to illuminate a first side of the relief precursor. The movable second light source is configured to illuminate a second side of the relief precursor opposite the first side. The movable shield is located between the first light source and the second light source and configured to capture at least a portion of the light from the second light source transmitted through the relief precursor. The moving means is configured to move the movable shield simultaneously with the second light source.

Thus, according to embodiments of the invention, a shield is used, which travels with the second light source to limit the amount of light from the second light source toward the first light source, and hence the amount of reflection by components of the first light source, such as a support on which the light elements are mounted, or by components near the first light source, such as a shutter arranged above the first light source. This will prevent or reduce the presence of ghost images generated by the reflected light. Further, the heating of the components of the first light source and of the components near the first light, is reduced. In particular, when a shutter is present above the first light source, the heating thereof may be reduced, and burning thereof is avoided.

Preferably, the first light source substantially extends in a plane intended for being oriented parallel to the relief precursor; and the second light source is movable in a plane parallel to the plane of the first light source. The first light source may comprise a plurality of first light emitting elements, such as light tubes or LEDs, and the plane is then a plane in which the plurality of first light emitting elements are located. Similarly, the second light source may comprise a plurality of second light emitting elements, and the plane is then a plane in which the plurality of second light emitting elements is located.

Preferably, the first light source is stationary. However, in other embodiments, e.g. when a LED array is used for the first light source, the first light source may be movable as well.

Preferably, the first light source is configured to illuminate a first illumination area of a plane and the second light source is configured to illuminate a second illumination area of said plane, wherein said plane is located between the shield and the second light source and corresponds with a plane in which the first side of the relief precursor is intended to be located, and wherein the term illumination area of a plane is defined by the area where the intensity is higher than 10% of a maximum value of the light intensity in said plane. When a carrying structure is present, the plane corresponds with a support surface of the carrying structure. Preferably, the second illumination area is at least two times, more preferably at least three times, and most preferably at least five times smaller than the first illumination area. In typical embodiments, the first light source is used to illuminate substantially the entire first side of the relief precursor, whilst the second light source illuminates a smaller area of the second side of the relief precursor, typically with a higher light intensity.

As mentioned above, the shield is configured to capture at least a portion of the electromagnetic radiation emitted of the second light source transmitted through the relief precursor. The term "capture" has to be interpreted as including absorbing a portion of the radiation and/or guiding a portion of the radiation away from an area at or near the first light source.

Preferably, the shield is non-transparent to electromagnetic radiation emitted from the second light source.

Preferably, a surface of the shield which is facing the second light source is configured to absorb more than 80% of electromagnetic radiation that is received on said surface, preferably more than 95%. This can be simply achieved by having a black surface.

Preferably, the shield is a plate-like element, but other shapes are also possible. For example, the shield could be a rod with a black outer surface or a sheet mounted in a frame.

According to a possible embodiment, the movable shield is mechanically coupled to the second light source, so that they can be easily moved simultaneously. According to another embodiment, the shield and the second light source can be moved independently and the moving means comprises a moving means for moving the second light source and a moving means for moving the shield. In the latter case, a controller may control the two moving means to obtain a synchronous movement of the second light source and the shield.

According to a preferred embodiment, a perpendicular projection of the shield on a plane intended to correspond in operation with the first side of the relief precursor, is 1 to 10% larger, preferably 5 to 10% larger than an illumination area of the second light source on said plane, wherein the illumination area is defined by the area where the intensity is higher than 10% of a maximum value of the light intensity in said plane.

Preferably, the apparatus further comprises a carrying structure configured for supporting the relief precursor. The carrying structure may be located between the second light source and the shield. Preferably, the carrying structure is transparent to electromagnetic radiation emitted from the first light source. The carrying structure may be e.g. a transparent glass plate, a screen of a transparent material or a transparent plastic.

Preferably, a distance between the carrying structure and the movable shield is less than 50 mm, preferably less than 20 mm, more preferably less than 10 mm. In that manner the shielding capacity of the shield can be increased whilst keeping the size of the shield limited.

Preferably, the carrying structure is a plate and the thickness of the carrying plate is between 2 mm and 20 mm. Preferably, the distance between the second light source and the carrying structure is between 10 mm and 100 mm.

Preferably, the second light source comprises a support, e.g. a printed circuit board (PCB), on which a plurality of light emitting elements, e.g. a LED array, is mounted.

Preferably, the support has a width which is smaller than 500 mm, e.g. between 100 mm and 400 mm.

Optionally, multiple second light sources and multiple shields may be provided. For example, two second light sources and two associates shields may be provided, each second light source intended to move along and partially illuminate the relief precursor, e.g. half of the relief precursor.

Optionally, the apparatus further comprises a cooling means configured to cool the movable shield. For example, the movable shield may be cooled with a gas or a fluid. In an exemplary embodiment, the movable shield may be provided with cooling channels through which a cooling medium is sent. Alternatively, a cool gas flow may be generated around the shield.

According to an exemplary embodiment, the first light source is selected from the group comprising: a plurality of LEDs, a set of fluorescent lamps, a flash lamp, a set of light tubes, an LCD screen, a light projection system (with movable mirrors), a sun light collection system, and combinations thereof. Preferably, the first light source takes the form of a LED array comprising a plurality of LEDs.

Preferably, the apparatus further comprises a controller for controlling the first light source in function of a location of the movable shield.

According to an exemplary embodiment, where the first light source comprises a set of light tubes or a LED array, then the controller may be configured for powering the first light source during a first time period and for powering and moving the second light source during a subsequent time period. In other words the first and second light source are operated one after the other. In that manner the back exposure will not be hindered by the shield or by light emitted by the second light source. UV tubes have the advantage that substantially the entire first side, i.e. the entire back side of the relief precursor may be exposed at the same time and this is often called flood exposure. The intensity output of a UV tube is rather homogeneous along its axis and by dense packing of the tubes the homogeneity is sufficient to produce printing plates.

According to another exemplary embodiment, where the first light source comprises a LED array, the controller may be configured for simultaneously powering the first and the second light source, wherein the first light source is controlled such that a group of light emitting elements of the LED array facing the shield are switched off whilst the other light emitting elements of the LED array are switched on, wherein said group is changing as the shield is moved. In that manner the amount of light emitted by the first light source toward the shield can be kept very low, avoiding or reducing undesired reflections on a side of the shield facing the first light source. This will also limit any heating of the shield due to light from the first light source. LEDs are advantageous for the first light source, because of their narrow emission spectrum and low energy consumption.

Preferably, the first light source comprises a support having a light absorbing surface, e.g. a black surface, facing the second light source. For example, when the first light source is a LED array, the LEDs may be mounted on a PCB and the PCB may be provided with a black outer surface. In that manner, any light reflected or transmitted in the direction of the first light source may be absorbed at least partially by the light absorbing surface of the support.

According to an exemplary embodiment, the first light source is an array of LEDs comprising a plurality of subsets of one or more LEDs, each subset being individually controllable. Preferably, the first light source is configured to illuminate simultaneously a predetermined surface area. The surface area may be adjusted for different relief precursor sizes. A controller may be configured to control the plurality of subsets individually, and such that an irradiation intensity variation in the predetermined surface area is within a predetermined range. By using a LED array with individually controllable subsets of LEDs, the irradiation intensity of the subsets can be adjusted to obtain a more or less homogeneous illumination of the surface area to be illuminated. In that manner a floor with a substantially constant thickness can be achieved. Further, when a LED fails, by having a controller configured to individually control the subsets, the subsets may be controlled to compensate for the failing LEDs, so that the homogeneity is not significantly influenced, whilst the failing LED may not need to be replaced. More details about such exemplary embodiments can be found in patent application NL 2023537 in the name of the applicant, which is included herein by reference.

Preferably, the first light source is configured to be movable in a direction perpendicular to a plane of the relief precursor, typically perpendicular to a transparent carrying plate for supporting the relief precursor. It is noted that the LED array may be moved and/or the carrying structure may be moved. Using such adjusting means, the homogeneity of the illumination in a desired plane can be further improved. For example, depending on the thickness of the relief precursor, the distance between the carrying structure and the LED array may be adjusted.

Preferably, the first light source is configured to deliver an intensity lower than that of the second light source. For example, the first light source may be configured to deliver an intensity equal to or below 100 mW/cm$^2$, and the second light source may be configured to deliver an intensity above 100 mW/cm$^2$, preferably above 350 mW/cm$^2$.

In an exemplary embodiment, the second light source is selected from the group comprising an LED array, a set of fluorescent lamps, a flash lamp, a set of light tubes arranged in a linear fashion, a (scanning) laser, a LCD screen, a light projection system (with movable mirrors) and combinations thereof. Preferably, the second light source is an array of LEDs comprising a plurality of subsets of one or more LEDs, each subset being individually controllable. The individual LEDs of the second light source may be controlled to illuminate an area with a substantially homogeneous intensity. Preferably, the second light source delivers an intensity above 100 mW/cm$^2$, more preferably above 350 mW/cm$^2$.

Preferably, the first and/or the second light source emit radiation with a wavelength in the range of 200 to 2000 nm, more preferably from 250 to 500 nm, even more preferably from 300 to 450 nm, most preferably from 270 to 410 nm, e.g. mainly at 365 nm.

According to a further embodiment, the apparatus comprises a shutter located between the first light source and the movable shield. A shutter may be necessary when fluorescent lamps are used, which need to be preconditioned before exposure starts in order to generate a stable light output. The shutter is made from a material which is non-transparent to the electromagnetic radiation emitted by the first light source. The shutter may be a rigid flat sheet, a combination of several flat sheets, a foldable structure, a curtain or a flexible material which may be wound onto a roll.

According to an exemplary embodiment, the moving means for the second light source and/or for the movable shield are one or more linear motors, one or more chains, cables or belts, one or more lead screws, a creep drive, one or more teeth wheel, a timing wheel, a belt, or combinations thereof.

Optionally one or more sensors, such as light sensors, magnetic sensors, proximity sensors, temperature sensors, overheating sensors, flow sensors, intensity sensors, pressure sensors, thickness sensors etc., may be provided. The movement of the second light source and/or of the shield and the driving of the first and/or second light source may then be further controlled in function of the sensor data measured by the one or more sensors.

Optionally, the apparatus may comprise an additional light source, an additional cooling means, a heating or cooling means, a transport means, a feeding means, an unloading means, a positioning means, an identification means, and combinations thereof. Optionally, the apparatus further comprises a controller to control various components of the apparatus and/or a housing with one or more openings (for loading and unloading the relief precursor). Optionally, the apparatus may comprise one or more additional treatment units selected from the group comprising loading and unloading units, an imaging unit, a liquid development unit, a thermal development unit, a drying unit, a post-treatment unit, a pre-treatment unit, a storage unit and combinations thereof.

According to another aspect of the invention, there is provided a method for exposing a relief precursor, preferably using an apparatus according to any one of the embodiments above. The method comprises:

a. placing a relief precursor between a first and a second light source;
b. exposing the relief precursor with the first light source;
c. moving the second light source whilst exposing the relief precursor with the second light source;
d. absorbing at least a portion of the light emitted by the second light source and transmitted through the relief precursor, in a space between the first light source and the relief precursor;
e. removing the relief precursor and performing optional further steps.

Preferably, the absorbing is done by moving a shield in the space between the first light source and the relief precursor during the exposing by the second light source. The shield may have any one of the features described above in connection with the apparatus.

The steps b) and c) may be performed sequentially or simultaneously, or in opposite order. When performed simultaneously step b) may be finished while step c) is still going on, or vice versa. For example, for thin plates step b) may be finished before step c), and for thick plates step c) may be finished before step b). For example, as explained above, when the first light source comprises a set of light tubes, the first light and second source may be powered consecutively. In another example, where the first light source comprises a plurality of LEDs, the powering of the first and second light source may be done simultaneously.

Further, step b) may comprise multiple exposing cycles and/or step c) may comprise multiple exposing and moving cycles, wherein the exposing cycles of steps b) and c) may be performed simultaneously, or sequentially in any order, wherein optionally an exposing cycle of step b) may be done between two exposure cycles of step c) and/or an exposing cycle of step c) may be done between two exposure cycles of step b). For example, step c) may consist in performing one or more first cycles where the second light source is moved back and forth and is controlled to emit light with a first intensity and one or more second cycles where the second light source is moved back and forth and is controlled to emit light with a second different intensity, preferably a second lower intensity. More generally, the timing and intensity of the exposing and moving in steps b) and c) may be controlled in any possible manner, and may be adjusted e.g. in function of the type of relief precursor. For example, when steps b) and c) are performed simultaneously, it is possible to adjust the timing such that whilst the first light source exposes at a high power level, the second light source is moved multiple times back and forth so that each portion of the relief precursor has received the same dose at the end of the exposure by the first light source. It is also possible to perform steps b) and c) according to two or more cycles, wherein these cycles may be periodic or non periodic. For example after a first exposure with the first light source and a first exposure with the second light source, a second or subsequent exposure with the first light source and a second or subsequent exposure with the second light source may be performed. The second or subsequent exposure with the first light source may be performed after or during the backward movement of the second light source.

Step c) may be performed by moving the second light source once or in cycles several times over the relief precursor. Further, in step c) the second light source may be moved forward over the relief precursor, or backward or both, and the second light source may be controlled to emit light during the forward movement, the backward movement or during both movements.

In step c) the speed of movement of the second light source may be the same for forward and backward movement or different. Further, in step d) the speed of the forward movement may be faster than that of the backward movement or vice versa. Optionally, in step c) the movements of the second light source may be performed periodically or with increasing or decreasing speeds for forward and/or backward movements.

According to a further developed embodiment, in step b) and/or c) the intensity distribution of the light output by the first and/or second light source may be varied during the movement. For example, in step c) the intensity of the light output may be different for forward and backward movement and/or may be different in different cycles. Also, in step b) and/or c) the intensity of the light output may be varied over time. Further, when the first light source comprises a LED array, in step b) the intensity of the light output of subsets of the LED array may be varied.

In an exemplary embodiment, steps b) and c) are performed simultaneously, and in step b) the intensity distribution of the light output by the first light source is correlated to the movement of the second light source in step c). For example, where the first light source comprises a LED array, the first and the second light source may be powered simultaneously, wherein the first light source is controlled such that a group of light emitting elements of the LED array facing the shield are switched off whilst the other light emitting elements of the LED array are switched on, wherein said group is changing as the shield is moved. Thus, the intensity distribution of the first light source will be changed as the shield is moved. In that manner the amount of light emitted by the first light source toward the shield can be kept very low, avoiding or reducing undesired reflections on a side of the shield facing the first light source. This will also limit any heating of the shield due to light from the first light source.

Preferably, the relief precursor is a precursor for an element selected from the group comprising: a flexographic printing plate, a relief printing plate, a letter press plate, an intaglio plate, a (flexible) printed circuit board, an electronic element, a microfluidic element, a micro reactor, a phoretic cell, a photonic crystal and an optical element, a Fresnel lens.

The optional further steps may be selected from the group of removal of uncured material, washing, drying, heating, post-exposure, grinding, cutting, and combinations thereof.

BRIEF DESCRIPTION OF THE FIGURES

The accompanying drawings are used to illustrate presently preferred non limiting exemplary embodiments of the apparatus and method of the present invention. The above and other advantages of the features and objects of the invention will become more apparent and the invention will be better understood from the following detailed description when read in conjunction with the accompanying drawings, in which.

DETAILED DESCRIPTION OF EMBODIMENTS

Figure 1:
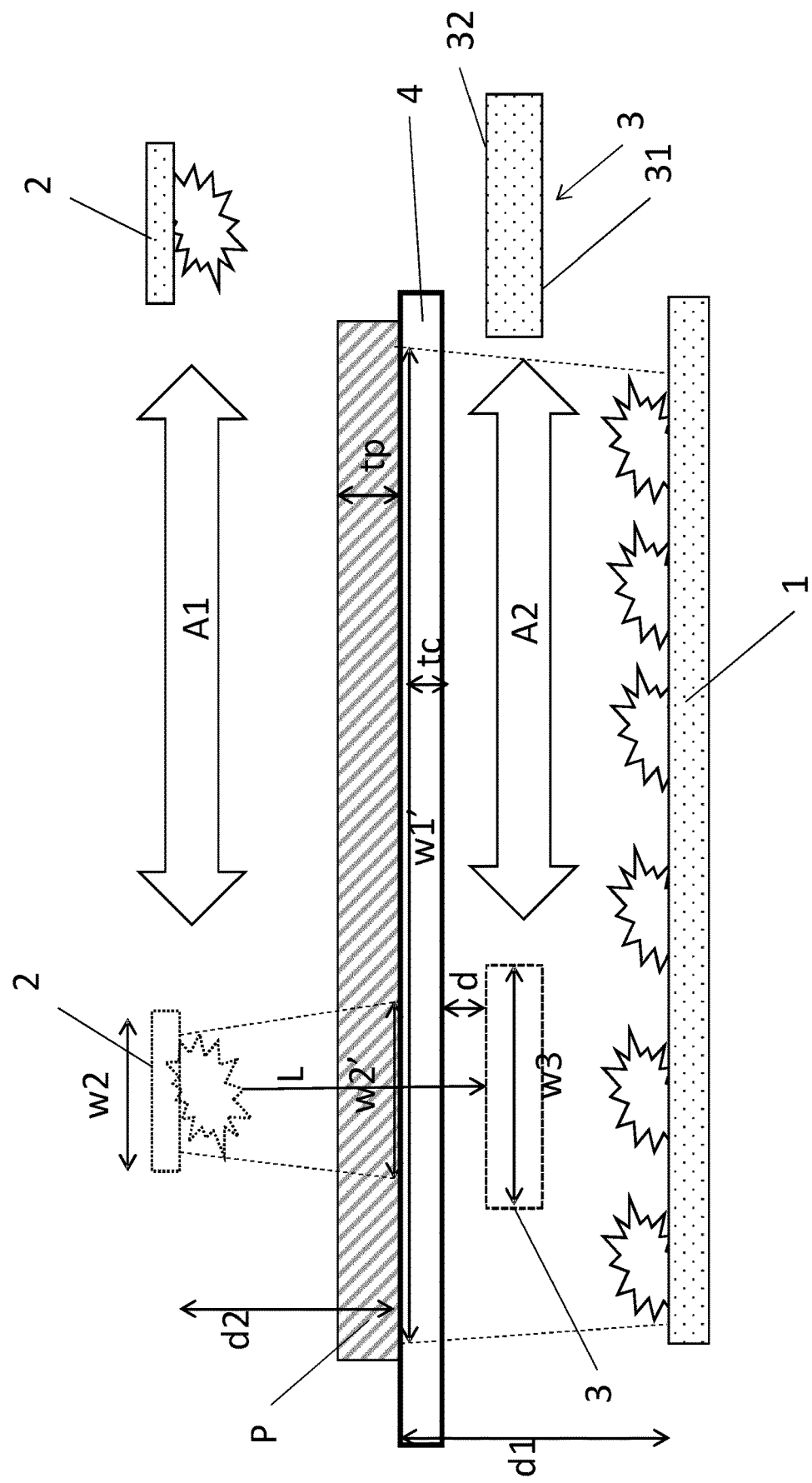
FIGS. 1-3 are schematic sectional views of exemplary embodiments of an apparatus for exposure of a relief precursor.

FIG. 1 schematically illustrates an apparatus for exposure of a relief precursor P which comprises a substrate layer and at least one photosensitive layer. The apparatus comprises a first light source 1, a movable second light source 2, a carrying structure 4, and a movable shield 3. The first light source 1 is configured to illuminate a first side of the relief precursor P, here a lower side also called back side. The movable second light source 2 is configured to illuminate a second side of the relief precursor P, opposite the first side. The second side is typically a top side of the relief precursor P. The movable shield 3 is located between the first light source and the second light source 2, and more in particular between the first light source 1 and the carrying structure 4.

The shield 3 is configured to capture at least a portion of the light of the second light source 2 transmitted through the relief precursor P, see arrow L. The shield 3 is non-transparent to electromagnetic radiation emitted from the second light source. The shield has a surface 32, here un upper surface, which is facing the second light source 2 and which is configured to absorb more than 80% of light that is received on said surface, preferably more than 95%. This upper surface 32 may be a black surface. In the illustrate embodiment, the shield 3 is a plate with a flat upper surface 32, but the skilled person understands that the shield may have any suitable shape, and may be e.g. a rod with a black outer surface. The shield 3 may be mechanically coupled to the second light source 2 or may be independently movable. Optionally, the apparatus may further comprising a cooling means (not shown) configured to cool the movable shield 3.

The first light source 1 substantially extends in a plane parallel to the relief precursor P. The first light source 1 is stationary. The second light source 2 is movable back and forward as indicated with arrow A1, in a plane parallel to the plane of the first light source 1. Also the shield 3 is movable back and forward as indicated with arrow A2, in a plane parallel to the plane of the first light source 1.

Preferably, the first light source 1 is configured to illuminate a first illumination area of a plane (having a width w1' in FIG. 1) and the second light source is configured to illuminate a second illumination area of said plane (having a width w2' in FIG. 1), wherein said plane is located between the shield and the second light source and corresponds with a plane in which the first side of the relief precursor is intended to be located. The term illumination area of a plane is defined by the area where the intensity is higher than 10% of a maximum value of the light intensity in said plane. When a carrying structure 4 is present, the plane corresponds with a support surface of the carrying structure 4. Preferably, the second illumination area (having a width w2' in FIG. 1) is at least two times, more preferably at least three times, and most preferably at least five times smaller than the first illumination area (having a width w1' in FIG. 1). In typical embodiments, the first light source 1 is used to illuminate substantially the entire first side (i.e. the entire backside) of the relief precursor, whilst the second light source 2 illuminates a smaller area of the second side (i.e. the upper side) of the relief precursor, typically with a higher light intensity.

A perpendicular projection of the shield 3 on the plane as defined above is 1 to 10% larger, preferably 5 to 10% larger than the second illumination area of the second light source 2 on said plane (having a width w2' in FIG. 1). For example, the width w3 of the shield 3 may be at least 5 mm more than the width w2' of the second illumination area. Preferably, the width w2, w2' and w3 are between 100 mm and 600 mm, e.g. between 200 mm and 400 mm. Preferably, the width w1' is between 1500 mm and 3000 mm, e.g. between 1800 mm and 2500 mm.

The carrying structure 4, e.g. a glass plate, is configured for supporting the relief precursor, and is located between the second light source 2 and the shield 3. The carrying structure 4 may be transparent to electromagnetic radiation emitted from the first light source 1. Preferably, a distance d between the carrying structure 4 and the movable shield is less than 50 mm, preferably less than 20 mm, more preferably less than 10 mm. Preferably, the carrying structure is a plate with a thickness tc between 0.5 and 20 mm (preferably between 1 and 15 mm) Preferably, the distance d2 between the second light source 2 and the carrying structure 4 is between 10 mm and 100 mm, e.g. between 20 mm and 50 mm. Preferably, the distance d1 between the first light source 1 and a support surface of the carrying structure 4 is between 10 mm and 150 mm, e.g. between 20 mm and 100 mm. Preferably, the thickness tp of the relief precursor P is between 0.5 mm and 10 mm (preferably between 1 and 7 mm).

The first light source 1 may be selected from the group comprising: a plurality of LEDs, a set of fluorescent lamps, a flash lamp, a set of light tubes, an LCD screen, a light projection system (with movable mirrors), a sun light collection system, and combinations thereof. The second light source 2 may be selected from the group comprising an LED array, a set of fluorescent lamps, a flash lamp, a set of light tubes arranged in a linear fashion, a (scanning) laser, an LCD screen, a light projection system (with movable mirrors), and combinations thereof.

Figure 2:
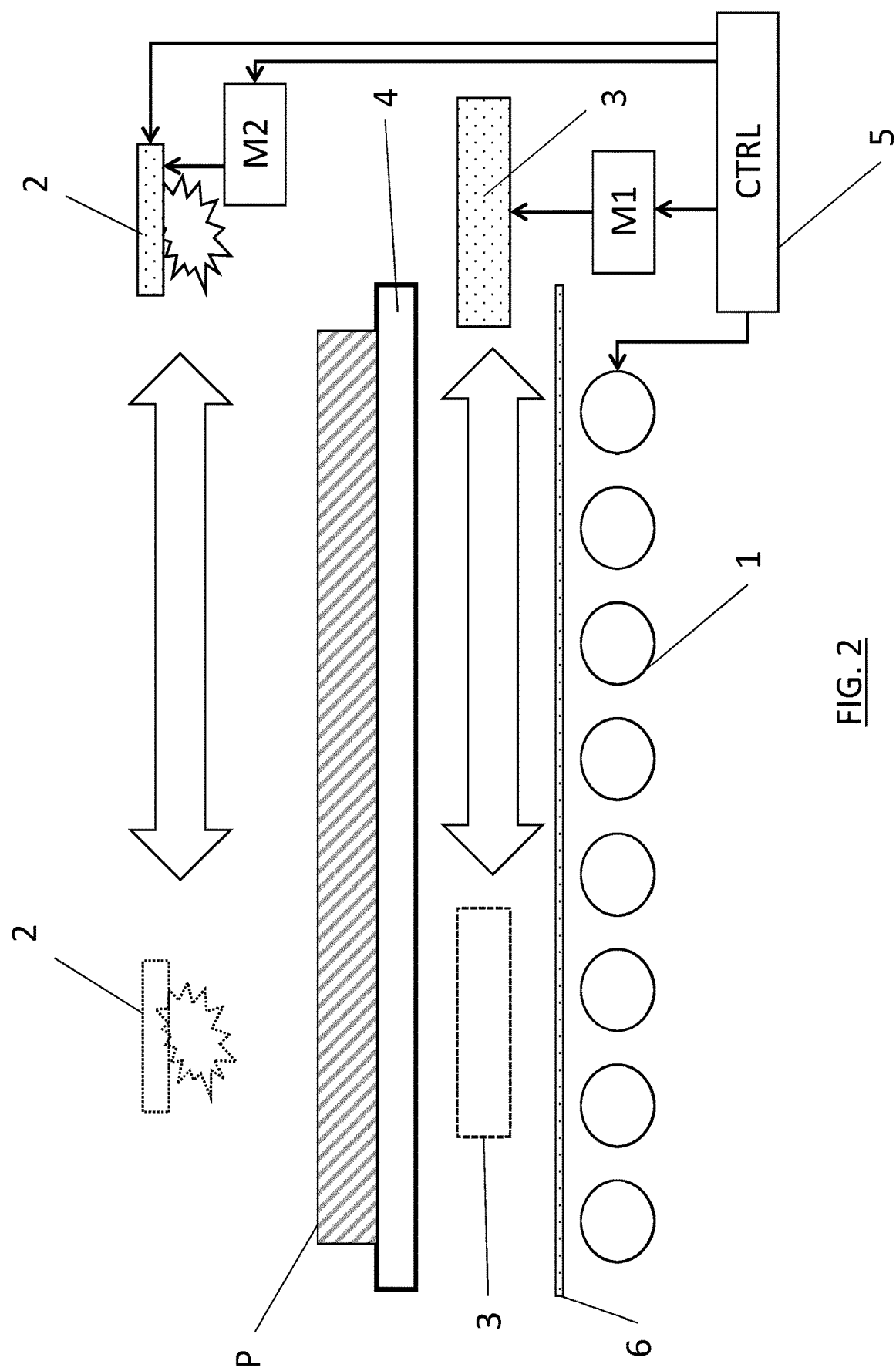

In the embodiment of FIG. 2, the first light source 1 comprises a set of UV light tubes. The driving of the first and second light source 1, 2 is done by a controller 5. The controller 5 may be configured for powering the first light source 1 during a first time period and for powering and moving the second light source 2 during a subsequent time period after said first period of time, when the first light source is off. It is also possible to perform the powering of the first and second light source 1, 2 according to two or more cycles, wherein these cycles may be periodic or non periodic. For example after a first exposure with the first light source 1 and a first exposure with the second light source 2, a second or subsequent exposure with the first light source 1 and a second or subsequent exposure with the second light source 2 may be performed. The second or subsequent exposure with the first light source 1 may be performed after or during the backward movement of the second light source 2.

FIG. 2 illustrates a moving means M1 configured to move the movable shield 3, and a moving means M2 configured to move the second light source 2. The controller 5 may control the moving means M1, M2 such that the second light source 2 and the shield 3 move synchronously, and the shield 3 performs an optimal shielding function. A shutter 6 which may be open or closed may be used to shield the UV light tubes 1 during preconditioning.

Figure 3:
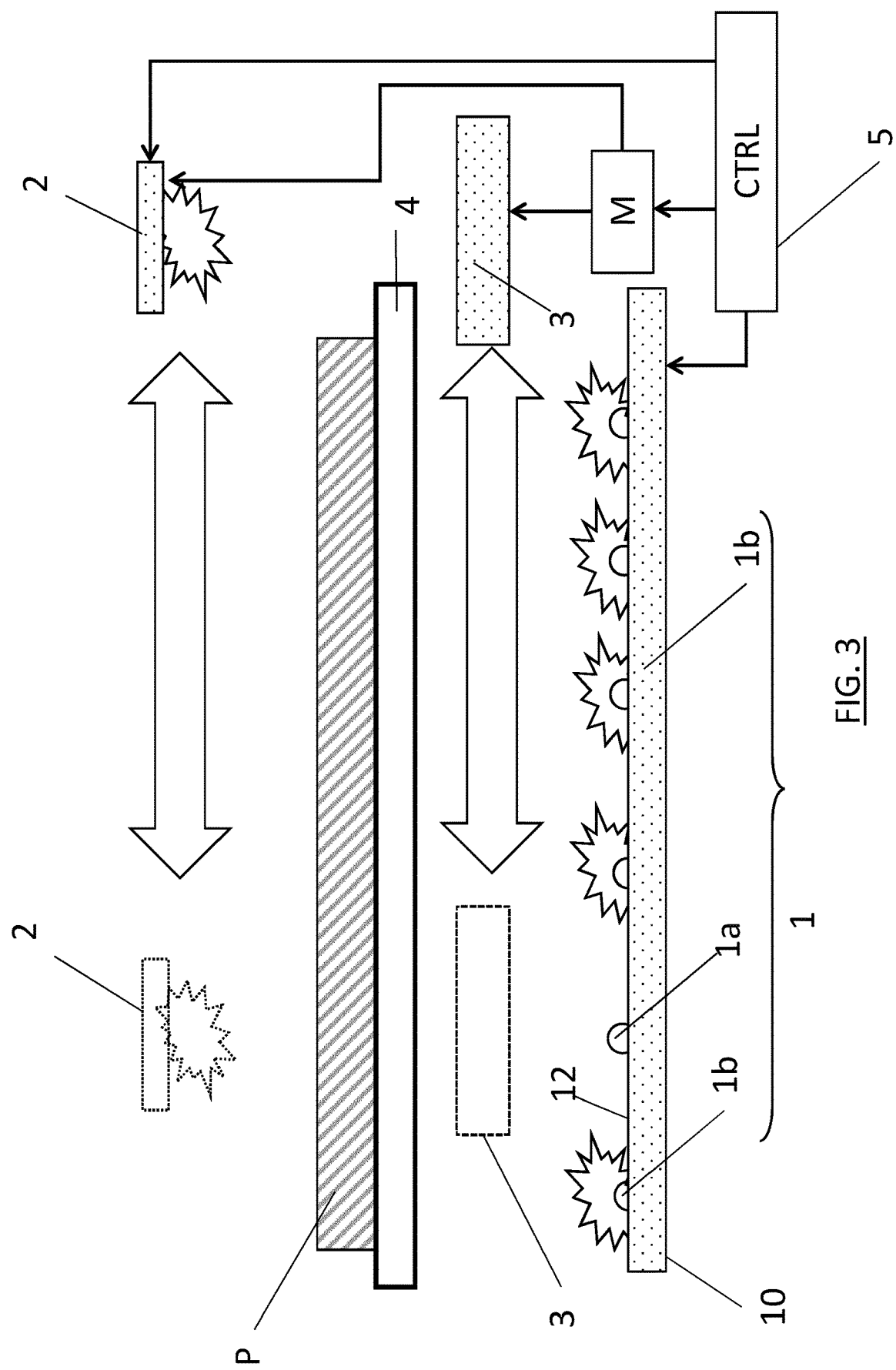

In the embodiment of FIG. 3, the first light source 1 comprises a LED array and the controller 5 is configured for simultaneously powering the first and the second light source 1, 2, wherein the first light source is controlled such that a group of light emitting elements 1a of the LED array facing the shield are switched off whilst the other light emitting elements 1b of the LED array are switched on, wherein said group 1a is changing as the shield 3 is moved. The first light source 1 comprises a support 10, typically a PCB, having a light absorbing surface 12, e.g. a black surface, facing the second light source 2.

FIG. 3 illustrates a moving means M configured to move the movable shield 3 simultaneously with the second light source 2. The controller 5 may control the moving means M such that the second light source 2 and the shield 3 move together, and may control the driving of the first light source such that the light distribution of the first light source 1 is adjusted in function of the position of the shield 3.

The exposing the relief precursor with the first light source 1 may be finished before the exposing of the relief precursor with the second light source 2, or vice versa. For example, for thin relief precursors the back-exposure by the first light source 1 may be finished before the main exposure by the second light source, and for thick plates the main exposure by the second light source 2 may be finished before the back-exposure by the first light source 1. Further, the exposure by the first and second light sources 1, 2 may be done in multiple cycles. For example, the main exposure may comprise one or more first fast cycles where the second light source 2 is moved back and forth and is controlled to emit light with a first intensity and one or more second slow cycles where the second light source 2 is moved back and forth and is controlled to emit light with a second different intensity, preferably a second lower intensity. The first fast cycles with a high intensity may be used to remove oxygen from the system, whilst the second slower cycles may slow down the polymerization. Simultaneously, the back-exposure by the first light source may be done. More generally, the timing and intensity of the exposing and moving steps by the first and second light source may be controlled in any possible manner, and may be adjusted e.g. in function of the type of relief precursor. For example, it is possible to adjust the timing such that whilst the first light source exposes at a high power level, the second light source is moved multiple times back and forth, so that each portion of the relief precursor has received the same dose at the end of the exposure by the first light source.

Figure 4:
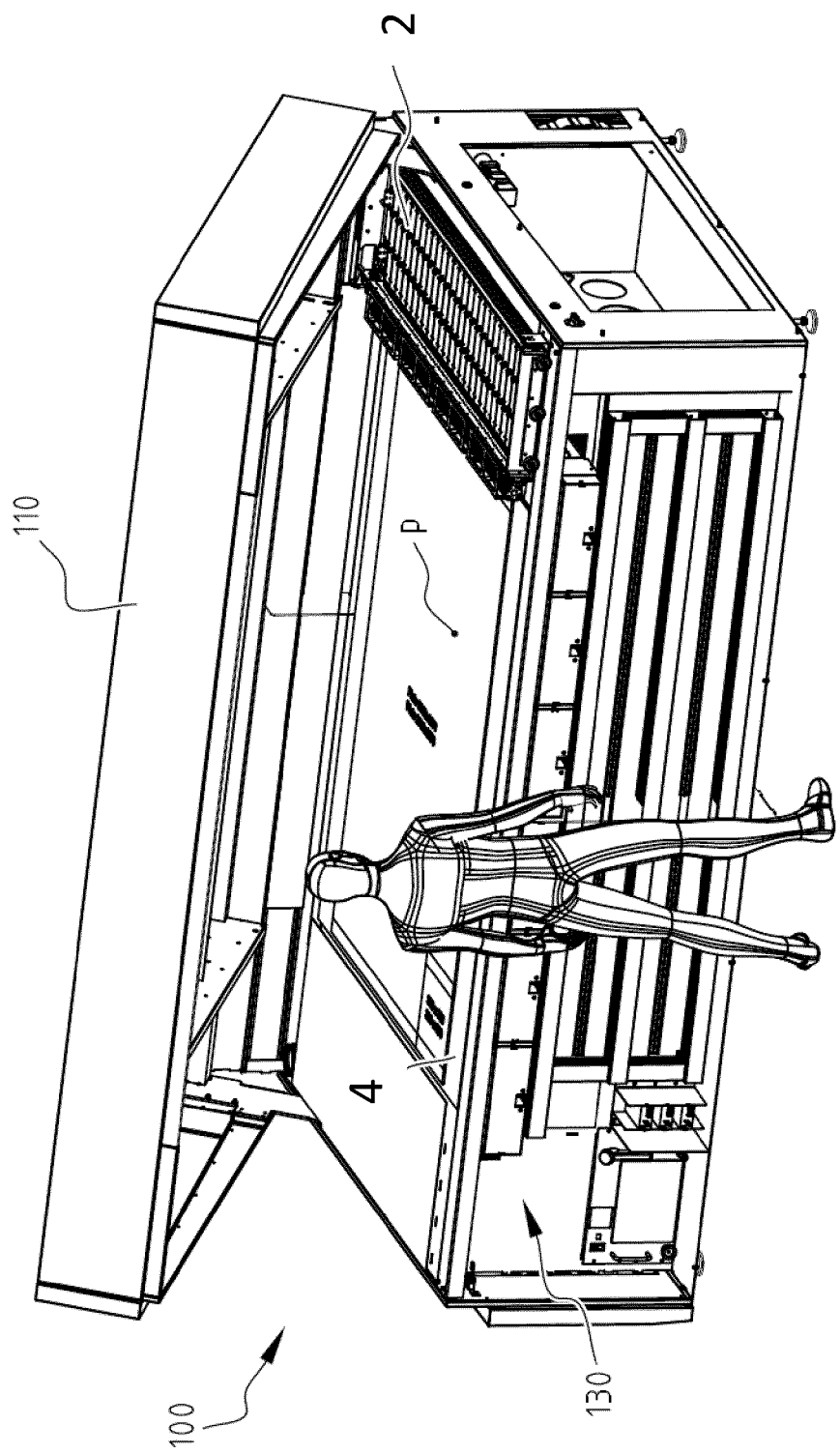
FIG. 4 is a perspective view of another exemplary embodiment of an apparatus for exposure of a relief precursor.

FIG. 4 illustrate in detail an exemplary embodiment which uses the same main components as the embodiment of FIGS. 1-3, and those components will not be described again. The apparatus comprises a housing 100 with a lower housing portion 130 comprising the first light source and an upper housing portion 110 optionally comprising an additional light source. The relief precursor P may be manually or automatically brought onto a carrying structure 4, such that the relief precursor is located between the first light source in the lower housing portion 130 and the upper housing portion 110. The apparatus comprises a second light source 2 comprising a moveable LED bar. The movable LED bar structure 2 can be moved from right to left and back.

In non-illustrated embodiments, a post-treatment unit may be provided to perform a post-treatment on the relief precursor, e.g. washing, drying, post-exposure, heating, cooling, removing of material, etc. Further, in non-illustrated embodiments, a pre-treatment unit may be provided to perform a pre-treatment on the relief precursor, said pre-treatment being selected from the group comprising: cutting, ablation, exposure to electromagnetic radiation, and combinations thereof.

A relief precursor generally comprises a support layer and at least one photosensitive layer. The support layer may be a flexible metal, a natural or artificial polymer, paper or combinations thereof. Preferably the support layer is a flexible metal or polymer film or sheet. In case of a flexible metal, the support layer could comprise a thin film, a sieve like structure, a mesh like structure, a woven or non-woven structure or a combination thereof. Steel, copper, nickel or aluminium sheets are preferred and may be about 50 to 1000 μm thick. In case of a polymer film, the film is dimensionally stable but bendable and may be made for example from polyalkylenes, polyesters, polyethylene terephthalate, polybutylene terephthalate, polyamides and polycarbonates, polymers reinforced with woven, nonwoven or layered fibres (e.g. glass fibres, Carbon fibres, polymer fibres) or combinations thereof. Preferably polyethylene and polyester foils are used and their thickness may be in the range of about 100 to 300 μm, preferably in the range of 100 to 200 μm.

In addition to the photosensitive layer and the support layer, the relief precursor may comprise one or more further additional layers. For example, the further additional layer may be any one of the following: a direct engravable layer (e.g. by laser), a solvent or water developable layer, a thermally developable layer, a mask layer, a cover layer, a barrier layer, etc. Between the different layers described above one or more adhesion layers may be located which ensure proper adhesion of the different layers.

Whilst the principles of the invention have been set out above in connection with specific embodiments, it is to be understood that this description is merely made by way of example and not as a limitation of the scope of protection which is determined by the appended claims.

The invention claimed is:

1. An apparatus for exposure of a relief precursor which comprises a substrate layer and at least one photosensitive layer, said apparatus comprising:
   a first light source configured to illuminate a first side of the relief precursor,
   a movable second light source configured to illuminate a second side of the relief precursor opposite the first side,
   a movable shield located between the first light source and the second light source and configured to capture at least a portion of the light of the second light source transmitted through the relief precursor, and
   a moving means configured to move the movable shield simultaneously with the second light source.

2. The apparatus according to claim 1, wherein the first light source substantially extends in a plane parallel to the relief precursor; and wherein the second light source is movable in a plane parallel to the plane of the first light source.

3. The apparatus according to claim 1, wherein the first light source is stationary.

4. The apparatus according to claim 1, wherein the first light source is configured to illuminate a first illumination area of a plane and the second light source is configured to illuminate a second illumination area of said plane, wherein said plane is located between the shield and the second light source and corresponds with a plane in which the first side of the relief precursor is intended to be located, wherein the second illumination area is at least two times smaller than the first illumination area.

5. The apparatus according to claim 1, wherein the shield is non-transparent to electromagnetic radiation emitted from the second light source.

6. The apparatus according to claim 1, wherein a surface of the shield which is facing the second light source is configured to absorb more than 80% of electromagnetic radiation that is received on said surface.

7. The apparatus according to claim 1, wherein the movable shield is mechanically coupled to the second light source or independently movable.

8. The apparatus according to claim 1, wherein a perpendicular projection of the shield on a plane located between the shield and the second light source and corresponding with a plane in which the first side of the relief precursor is intended to be located, is 1 to 10% larger than an illumination area of the second light source on said plane, wherein the illumination area is defined by the area where the intensity is higher than 10% of a maximum value of the light intensity in said area.

9. The apparatus according to claim 1, further comprising a carrying structure configured for supporting the relief precursor, said carrying structure being located between the second light source and the shield, wherein preferably the carrying structure is transparent to electromagnetic radiation emitted from the first light source, and wherein preferably a distance between the carrying structure and the movable shield is less than 50 mm.

10. The apparatus according to claim 1, further comprising a cooling means configured to cool the movable shield.

11. The apparatus according to claim 1, wherein the first light source is selected from the group comprising: a plurality of LEDs, a fluorescent lamp, a flash lamp, a set of light tubes, an LCD screen, a light projection system, a sun light collection system, and combinations thereof.

12. The apparatus according to claim 1, further comprising a controller comprising circuitry configured to process instructions for controlling the first light source in function of a location of the movable shield.

13. The apparatus according to claim 12, wherein the first light source comprises a set of light tubes and wherein the controller comprising circuitry configured to process instructions for powering the first light source during a first time period and for powering and moving the second light source during a subsequent time period.

14. The apparatus according to claim 12, wherein the first light source comprises a LED array and wherein the controller comprises circuitry configured to process instructions for simultaneously powering the first and the second light source, wherein the first light source is controlled such that a group of light emitting elements of the LED array facing the shield are switched off whilst the other light emitting elements of the LED array are switched on, wherein said group is changing as the shield is moved.

15. The apparatus according to claim 1, wherein the first light source comprises a support having a light absorbing surface facing the second light source.

16. A method for exposing a relief precursor, said method comprising:
   a. placing a relief precursor between a first and a second light source;
   b. exposing the relief precursor with the first light source;
   c. moving the second light source whilst exposing the relief precursor with the second light source;
   d. absorbing at least a portion of the light emitted by the second light source and transmitted through the relief precursor, in a space between the first light source and the relief precursor; and
   e. removing the relief precursor from between the first and second light source.

17. The method according to claim 16, wherein the absorbing is done by moving a shield in the space between the first light source and the relief precursor during the exposing by the second light source.

18. The method according to claim 16, wherein steps b) and c) are performed sequentially in any order, or simultaneously, wherein step b) may be finished before, after or at the same time as step c).

19. The method according to claim 16, wherein step b) comprises multiple exposing cycles and/or wherein step c) comprises multiple exposing and moving cycles, wherein the exposing cycles of steps b) and c) may be performed simultaneously, or sequentially in any order, wherein optionally an exposing cycle of step b) may be done between two exposure cycles of step c) and/or an exposing cycle of step c) may be done between two exposure cycles of step b).

20. The method according to claim 16, wherein steps b) and c) are performed simultaneously, and in step b) the intensity distribution of the light output by the first light source is correlated to the movement of the second light source in step c).

21. An apparatus for exposure of a relief precursor which comprises a substrate layer and at least one photosensitive layer, said apparatus comprising:
   a first light source comprising a LED array configured to illuminate a first side of the relief precursor,
   a second light source configured to illuminate a second side of the relief precursor opposite the first side,
   a moving mechanism configured to cause a movement of the second light source relative to the relief precursor; and
   a controller comprising circuitry configured to process instructions for controlling the first light source and the second light source, wherein the controller comprises circuitry configured to process instructions is configured for correlating the intensity distribution of the light output by the LED array to the movement of the second light source relative to the relief precursor.

22. The apparatus of claim 21, wherein the controller comprises circuitry configured to process instructions for simultaneously powering the first and the second light source, wherein the LED array of the first light source is controlled such that a group of light emitting elements of the LED array facing the second light source are switched off whilst the other light emitting elements of the LED array are switched on, wherein said group is changing as the second light source is moved relative to the relief precursor.

23. An apparatus for exposure of a relief precursor which comprises a substrate layer and at least one photosensitive layer, said apparatus comprising:
   a first light source comprising a LED array configured to illuminate a first side of the relief precursor, and
   a second light source configured to illuminate a second side of the relief precursor opposite the first side,
   wherein the first light source comprises a support having a light absorbing surface facing the second light source, such that light reflected or transmitted in the direction of the first light source is absorbed at least partially by the light absorbing surface of the support.

24. The apparatus of claim 23, wherein the support comprises a printed circuit board with a black outer surface.

25. The apparatus of claim 23, further comprising a moving mechanism configured to cause a movement of the second light source relative to the relief precursor.

26. An apparatus for exposure of a relief precursor which comprises a substrate layer and at least one photosensitive layer, said apparatus comprising:
   a static first light source comprising a LED array configured to illuminate a first side of the relief precursor,
   a moveable second light source configured to illuminate a second side of the relief precursor opposite the first side,
   a moving mechanism configured to cause a movement of the second light source relative to the relief precursor whilst exposing the relief precursor with the second light source; and
   a controller programmed to execute instructions for controlling the moving mechanism, the first light source and the second light source, said controller further programmed to perform at least one of the following steps:
      adjusting an exposure timing of the first and second light source such that whilst the first light source exposes at a first power level, the second light source is moved multiple times back and forth so that each portion of the relief precursor has received the same dose at the end of the exposure by the first light source; and
      adjusting an exposure timing of the first and second light source such that, after a first exposure with the first light source and a first exposure with the second light source, a second or subsequent exposure with the first light source and a second or subsequent exposure with the second light source is performed.

* * * * *

UNITED STATES PATENT AND TRADEMARK OFFICE
CERTIFICATE OF CORRECTION

| | | |
|---|---|---|
| PATENT NO. | : 12,174,543 B2 | Page 1 of 1 |
| APPLICATION NO. | : 17/793870 | |
| DATED | : December 24, 2024 | |
| INVENTOR(S) | : De Rauw et al. | |

It is certified that error appears in the above-identified patent and that said Letters Patent is hereby corrected as shown below:

In the Claims

Column 13, Lines 51 and 52, Claim 21, please delete "is configured" after "instructions"

Signed and Sealed this
Twenty-ninth Day of April, 2025

Coke Morgan Stewart
*Acting Director of the United States Patent and Trademark Office*